United States Patent
Krauss et al.

(10) Patent No.: US 10,654,716 B2
(45) Date of Patent: May 19, 2020

(54) METHOD FOR PACKAGING AT LEAST ONE SEMICONDUCTOR COMPONENT AND SEMICONDUCTOR DEVICE

(71) Applicant: Robert Bosch GmbH, Stuttgart (DE)

(72) Inventors: Andreas Krauss, Tuebingen (DE); Nicola Mingirulli, Stuttgart (DE); Robert Bonasewicz, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 8 days.

(21) Appl. No.: 15/778,956

(22) PCT Filed: Nov. 22, 2016

(86) PCT No.: PCT/EP2016/078410
§ 371 (c)(1),
(2) Date: May 24, 2018

(87) PCT Pub. No.: WO2017/089338
PCT Pub. Date: Jun. 1, 2017

(65) Prior Publication Data
US 2018/0346327 A1    Dec. 6, 2018

(30) Foreign Application Priority Data
Nov. 26, 2015   (DE) .................. 10 2015 223 399

(51) Int. Cl.
*B81C 1/00* (2006.01)
*B81B 7/00* (2006.01)
(Continued)

(52) U.S. Cl.
CPC ...... *B81C 1/00825* (2013.01); *B81C 1/00333* (2013.01); *H01L 23/28* (2013.01);
(Continued)

(58) Field of Classification Search
CPC ... H01L 23/31; H01L 23/315; H01L 23/3114; B81C 1/00801; B81C 2203/0136;
(Continued)

(56) References Cited

U.S. PATENT DOCUMENTS 5,374,792 A   12/1994  Ghezzo et al.
8,159,056 B1   4/2012  Kim et al.
(Continued)

FOREIGN PATENT DOCUMENTS

DE   102010064108 A1   6/2012
DE   102011084582 B3   2/2013
(Continued)

OTHER PUBLICATIONS

International Search Report dated Feb. 27, 2017 of the corresponding International Application PCT/EP2016/078410 filed Nov. 22, 2016.

*Primary Examiner* — Mohsen Ahmadi
(74) *Attorney, Agent, or Firm* — Norton Rose Fulbright US LLP; Gerard Messina

(57) ABSTRACT

At least one semiconductor component is packaged by covering at least one partial surface of the at least one semiconductor component with at least one chemically or physically dissoluble sacrificial material; surrounding the at least one semiconductor component at least partially with a photoablatable packaging material; exposing the sacrificial material on the at least one partial surface of the at least one semiconductor component at least partially by forming at least one trench through at least the packaging material using a light beam; and exposing the at least one partial surface of the at least one semiconductor component at least partially by at least partially removing the previously exposed sacrificial material using a chemical or physical (Continued)

removal method to which the packaging material has a higher resistance than the sacrificial material.

20 Claims, 7 Drawing Sheets

(51) Int. Cl.
 *H01L 23/28* (2006.01)
 *H01L 23/00* (2006.01)

(52) U.S. Cl.
 CPC ............ *H01L 24/45* (2013.01); *B81B 7/0058* (2013.01); *B81B 2201/0264* (2013.01); *B81C 1/00* (2013.01); *B81C 1/00309* (2013.01); *B81C 2203/0136* (2013.01); *B81C 2203/0154* (2013.01); *H01L 2224/48091* (2013.01); *H01L 2224/48465* (2013.01); *H01L 2924/00014* (2013.01)

(58) Field of Classification Search
 CPC .... B81C 2203/0154; B81C 2201/0108; B81C 1/00309; B81C 1/00071; B81C 1/00261; B81C 1/00476; B81C 1/00047; B81C 1/00; B81B 7/0058
 See application file for complete search history.

(56) References Cited

U.S. PATENT DOCUMENTS

| | | | |
|---|---|---|---|
| 2002/0086455 A1* | 7/2002 | Franosch | B81C 1/00047 438/51 |
| 2005/0101121 A1* | 5/2005 | Kim | H01L 21/76885 438/634 |
| 2007/0275502 A1* | 11/2007 | George | B81C 1/00333 438/106 |
| 2010/0003789 A1 | 1/2010 | Caplet et al. | |
| 2010/0284553 A1* | 11/2010 | Conti | B81B 7/0061 381/174 |
| 2010/0307786 A1 | 12/2010 | Kohl et al. | |
| 2012/0175747 A1* | 7/2012 | Schlarmann | B81C 1/00309 257/622 |
| 2013/0105920 A1* | 5/2013 | Herrin | H01L 23/544 257/415 |
| 2015/0035091 A1* | 2/2015 | Ziglioli | B81B 3/0021 257/415 |
| 2015/0249043 A1* | 9/2015 | Elian | H01L 21/4867 257/684 |

FOREIGN PATENT DOCUMENTS

| | | |
|---|---|---|
| EP | 2297025 A2 | 3/2011 |
| WO | 2015094116 A1 | 6/2015 |

* cited by examiner

METHOD FOR PACKAGING AT LEAST ONE SEMICONDUCTOR COMPONENT AND SEMICONDUCTOR DEVICE

CROSS-REFERENCE TO RELATED APPLICATIONS

The present application is the national stage of International Pat. App. No. PCT/EP2016/078410 filed Nov. 22, 2016, and claims priority under 35 U.S.C. § 119 to DE 10 2015 223 399.5, filed in the Federal Republic of Germany on Nov. 26, 2015, the content of each of which are incorporated herein by reference in their entireties.

FIELD OF THE INVENTION

The present invention relates to a method for packaging at least one semiconductor component and to a corresponding a semiconductor device.

BACKGROUND

A method for packaging a sensor chip and a component manufactured in accordance with it are described in DE 10 2010 064 108 A1. In one specific embodiment of the method for packaging a sensor chip, the sensor chip is assembled on an assembly surface of a carrier. After that, the carrier is provided with a metallic coating in the region next to the assembly surface of the sensor chip. Subsequently, a (laser-patternable) polymer layer extending from the metallic coating to a sensitive region of the sensor chip is formed, the polymer layer providing a partial section of a future media entrance. The sensor chip is then at least partially embedded in a molding material. Finally, a residual section of the media entrance is produced by laser-patterning the molding material and the polymer layer, the metallic coating being used as an etch stop layer.

SUMMARY

According to an example embodiment of the present invention, a method for packaging at least one semiconductor component is highly cost-effective and simple to implement and is particularly suitable for sensor components (sensor chips), which also need at least one (locally delimited) media entrance and/or at least one (locally delimited) measuring passage after their packaging. In contrast to the related art, the present invention does not require a metallic coating as an etch stop layer during laser-patterning. Instead, the chemically or physically dissoluble sacrificial material satisfies the function of a "laser-stop layer or laser-absorber layer." Consequently, no metallic coating must be formed to execute the method of the present invention for packaging at least one semiconductor component. In the same way, no metallic coating must be removed or accepted as a superfluous component on the finished semiconductor device. Therefore, the present invention reduces the production costs of a semiconductor device manufactured with the aid of the method according to the present invention. In addition, since it is comparatively simple to manufacture, the semiconductor device of the present invention can be formed while reliably adhering to a desired standard (with a high quality and a low error rate).

The present invention provides molded housings for packaging semiconductors and microsystem technology components. It is also suited for the plastic molded package technology of MEMS sensors having a MEMS sensor package. The present invention is also usable for packaging semiconductor components on the wafer level. The present invention also contributes towards protecting semiconductor components during semiconductor processing, since the at least one packaged semiconductor component may be processed further in a (nearly) risk-free manner.

The method and semiconductor devices of the present invention are suited for sensors having at least one media entrance and/or having at least one measuring passage. Such sensors can be, for example, inertial sensors, pressure sensors, acceleration sensors, flow sensors, moisture sensors, and/or chemical detection sensors (liquid sensors and/or gas sensors). The suitability of the method and semiconductor devices according to the present invention is not limited to a particular type of chemical or physical sensor.

In one advantageous example embodiment of the method, in each instance, with the aid of the light beam, the at least one trench is formed to have at least one first trench wall surface, which adjoins an outer boundary surface of the packaging material, is made of the packaging material and has photoablation traces; and, with the aid of the chemical or physical removal method, the at least one trench is formed to have at least one second trench wall surface, which, in comparison with the at least one trench wall surface of the same trench, is closer to the associated partial surface, is made at least partially of the packaging material, and is formed with filler removal traces, etching residues, and/or molding effects; the respective, at least one trench between the at least one first trench wall surface and the at least one second trench wall surface being formed free of a metallic coating.

For example, to cover the at least one partial surface, a sacrificial material layer of the sacrificial material can be deposited on the at least one semiconductor component and patterned in such a manner that the at least one partial surface remains covered by the sacrificial material; at least one concave outer surface and/or at least one convex outer surface of the sacrificial material covering the at least one partial surface being formed. This is recognizable in that the at least one second trench wall surface formed at least partially from the packaging material is formed with a convex area of curvature and/or a concave area of curvature.

In the same manner, a photopatternable layer on the sacrificial material layer can be patterned in order to pattern the sacrificial material layer; at least a residual region of the photopatternable layer being partially removed during the forming of the at least one trench with the aid of the light beam. This remains visible, since material residues of the photopatternable layer remain between the at least one first trench wall surface and the at least one second trench wall surface, or a molding of the material residues of the photopatternable layer between the at least one first trench wall surface and the at least one second trench wall surface is removed.

In one advantageous application of the method, at least one sensor component is packaged as the at least one semiconductor component, using the packaging material; at least one media entrance and/or at least one measuring passage being formed as the at least one trench. Consequently, the method can be used for packaging sensors/sensor elements cost-effectively. However, an ability to implement the method is not limited to a particular construction of the at least one sensor component, and/or to a particular use of the at least one trench.

For example, at least one sensitive material for detecting at least one substance is deposited on the at least one exposed partial surface. Thus, the example embodiment of the method described here is suited particularly well for packaging detection sensors, such as gas sensors.

In particular, at least two trenches can be formed per semiconductor component; different sensitive materials being deposited in the at least two trenches per semiconductor component.

Therefore, a single semiconductor component/sensor component packaged with the aid of the example embodiment of the method described here can be used for detecting a plurality of substances. The multifunctionality of the individual semiconductor component/sensor component ensured in this manner allows additional components for substance detection to be dispensed with. In addition, the example embodiment of the method described here contributes towards reducing manufacturing costs, a space requirement, and a mounting surface for a detection system for detecting a plurality of substances.

In one further advantageous example embodiment of the method, the at least one trench is formed through at least the packaging material, with the aid of a light beam, in at least the shape of a framing of a plug; during removal of the previously exposed sacrificial material, the plug also being removed at least partially by the chemical or physical removal method. Consequently, using this example embodiment of the method, relatively large cavities can be formed at the at least one packaged semiconductor component, without the entire packaging material removal additionally having to be carried out by the light beam.

In addition, the at least one trench can be formed through at least the packaging material by the laser beam, in the form of a partial frame of a subsequent partial shield of the at least one partial surface; the sacrificial material situated between the partial shield and the respective partial surface being at least partially removed with the aid of the chemical or physical removal method. The partial shield formed in this manner can contribute towards protecting the semiconductor component equipped with it from contamination and/or the action of a force.

The advantages described in the preceding paragraphs are also realized in a corresponding semiconductor device. In addition, the semiconductor device can be developed further in accordance with the above-described example embodiments of the manufacturing method.

Additional features and advantages of the present invention are explained below, with reference to the figures.

DETAILED DESCRIPTION

Figure 1A:
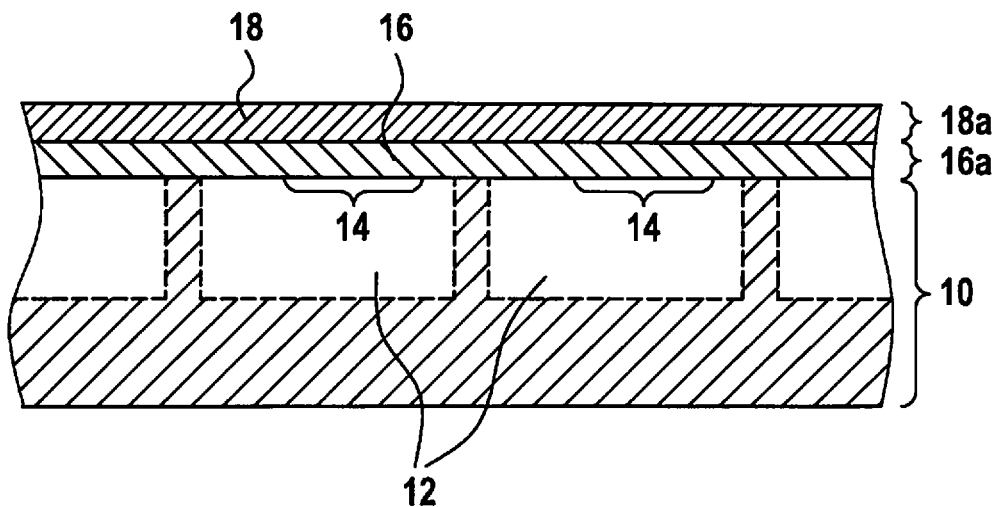
FIGS. 1a-1h are schematic cross sections for explaining a method for packaging at least one semiconductor component, according to a first example embodiment of the present invention.

A semiconductor wafer 10, which is made of at least one semiconductor material, such as silicon, and in which a plurality of (functionalized) semiconductor components (semiconductor chips) 12 are formed, is represented by way of example in FIG. 1a. In this manner, it is intended to be illustrated, that the method steps described in the following can also be executed on the wafer level. However, (almost all of) the method steps described in the following can also be implemented with only a single semiconductor component 12 (instead of the plurality of semiconductor components 12).

In addition to the at least one semiconductor material, semiconductor wafer 10/the at least one semiconductor component 12 can also include at least one insulating material and/or at least one metal (for example, in the form of a circuit trace). With the aid of the at least one metal, light can be reflected, in particular, in response to subsequent (intense) illumination of semiconductor wafer 10/of the at least one semiconductor component 12. In this manner, damage to/bleaching of materials covered by the at least one metal can be prevented. The at least one metal can be, e.g., aluminum, AlSiCu and/or at least one precious metal (such as gold or platinum). The at least one insulating material can be, e.g., silicon oxide, silicon nitride, and/or aluminum oxide.

Several 10000's of semiconductor components 12 can be formed in semiconductor wafer 10. Each of semiconductor components 12 can be configured, e.g., with a functionalized surface of approximately 1 mm$^2$. Semiconductor wafer 10 v have a diameter of approximately 200 mm. Individual semiconductor components 12 can be separated from each other by nonfunctional regions.

In order to execute the method for packaging at least one semiconductor component (semiconductor chip) 12, at least one partial surface 14 of the at least one semiconductor component 12 is covered by at least one chemically or physically dissoluble sacrificial material 16. For example, to cover the at least one partial surface 14, a sacrificial material layer 16a (of sacrificial material 16) is deposited on the at least one semiconductor component 12 and patterned in such a manner, that the at least one partial surface 14 remains covered by sacrificial material 16. Sacrificial material layer 16a can have a layer thickness between 1 μm and 10 μm.

In the specific embodiment described here, in order to pattern sacrificial material layer 16a, a photopatternable layer 18a (of a photopatternable material 18) is deposited on sacrificial material layer 16a and (subsequently) patterned. A layer thickness of photopatternable layer 18a can be, for example, in a range of 0.5 μm to 5 μm. (However, the numerical values mentioned here for the layer thicknesses of layers 16a and 18a are only to be interpreted as illustrative. In the case of other layer thicknesses of layers 16a and 18a, as well, a lithography step for their patterning can still be carried out successfully.)

FIG. 1a shows the semiconductor wafer 10 after the deposition of layers 16a and 18a. However, the use of photopatternable layer 18a for patterning sacrificial material layer 16a is optional. As an alternative, a sacrificial material 16, which is easily patternable without the use of an additional material, can also be used. In place of photopatternable material 18, another material patternable in a spatially resolved manner with the aid of a semiconductor method can also be used for patterning sacrificial material layer 16a.

Sacrificial material 16 is a material that is chemically dissoluble (with the aid of a solvent) or physically dissoluble (e.g., with the aid of an oxygen plasma). Use of a photopatternable material as sacrificial material 16 is optional, but use of a non-photopatternable/non-laser-patternable material as sacrificial material 16 is preferred. Photopatternable material 18 is, for example, a photolithographic lacquer.

Figure 1B:
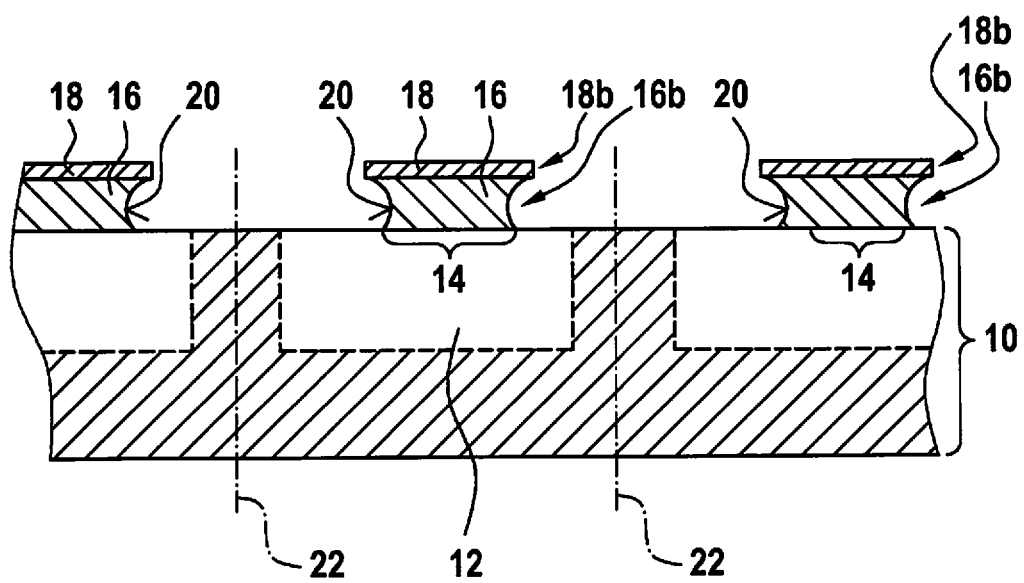

FIG. 1b shows the layer construction after a patterning of photopatternable layer 18a, the sacrificial layer 16a covered by photopatternable layer 18a being patterned as well. Photopatternable layer 18a can be dissolved, for example, at previously irradiated locations with the aid of a wet-chemical method step, through which the sacrificial material layer 16a at the locations cleared of photopatternable layer 18a is also dissolved, as well. This is preferably accomplished, e.g., with the aid of an alkaline developer.

The patterning of layers 16a and 18a takes place in such a manner that the residual regions 16b and 18b (of materials 16 and 18) covering the at least one partial surface 14 remain. In addition, at least one curved outer surface 20 of the sacrificial material 16/residual region 16b covering the at least one partial surface 14 is formed. As a rule, curved outer surface 20 of the sacrificial material 16/residual region 16b covering the at least one partial surface 14 is a concave outer surface 20. Curved outer surface 20 can possibly be formed as a convex outer surface of the sacrificial material 16/residual region 16b covering the at least one partial surface 14, as well. The at least one curved outer surface 20 of the sacrificial material 16/residual region 16b covering the at least one partial surface 14 is formed, since sacrificial material 16 is attacked/etched at its lateral edges during the patterning. (The at least one curved outer surface 20 can be understood to mean "an outer surface curved inwards." It can extend from associated partial surface 14 to the covering residual region 18b of photopatternable material 18.)

As depicted by separating lines 22 in FIG. 1b, semiconductor components 12 can be cut apart after the patterning of (at least) sacrificial material layer 16a. However, it is emphasized that the method steps described below are also implementable on the wafer level. At this stage of the method, the sectioning of semiconductor components 12 of semiconductor wafer 10, depicted by separating lines 22, is merely optional.

Separating lines 22 can run, for example, through the nonfunctional regions between two adjacent semiconductor components 12 of semiconductor wafer 10. The separating of semiconductor components 12 can be accomplished, for example, using a light beam (subsequently still used). For example, a laser can be used for separating semiconductor components 12. (As a rule, separating lines 22 produced by a laser have a width of 30 μm to 50 μm.) During the separating, residual regions 16b and 18b of materials 16 and 18 remain (at this stage of the method) on the at least one partial surface 14. Therefore, damage to or contamination of the at least one partial surface 14, e.g., by particles released during the separating or by cooling water used during the separating, need not be feared during the separating.

Figure 1C:
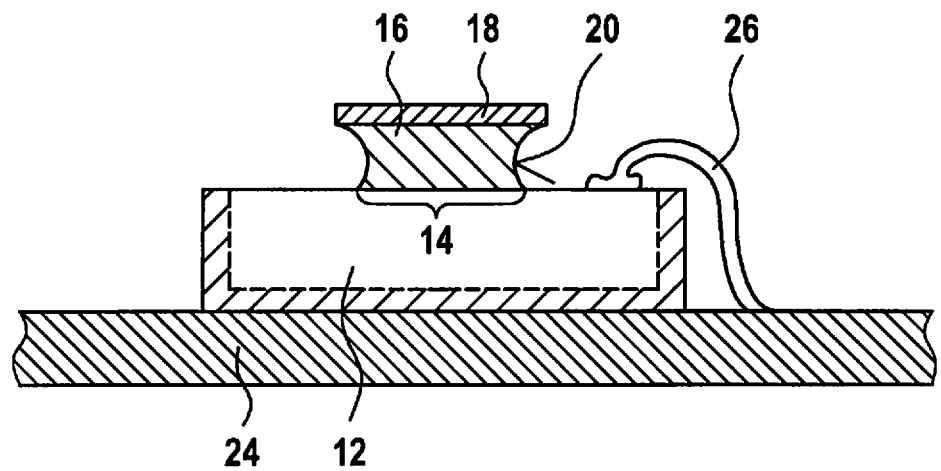

FIG. 1c shows a circuit board 24, on which at least one (sectioned) semiconductor component 12 (that is also possibly thinned on the backside) is situated/mounted. Semiconductor component 12 can be adhesively bonded to circuit board 24. The at least one semiconductor component 12 can be transported using a pick-and-place method. Residual regions 16b and 18b of materials 16 and 18 remain during the transporting of the at least one semiconductor component 12 and the mounting of the at least one semiconductor component 12 to circuit board 24. Therefore, in all of the method steps described here, the at least one semiconductor component 12 is protected from contamination or damage at least at the at least one partial surface 14. In addition, vacuum suction can take place at residual regions 16b and 18b for the pick-and-place method.

Circuit board 24 can be used as a future base plate of a land grid array housing. Circuit board 24 can also receive several (up to a hundred) individual semiconductor components 12. However, the use of circuit board 24 is not necessary for implementing the method described here.

The at least one semiconductor component 12 on circuit board 24 can optionally be electrically connected to it with the aid of a wire bond 26. (An individual semiconductor component 12 can have a plurality of wire bonds 26, e.g., twelve wire bonds 26.) The residual regions 16b and 18b of materials 16 and 18 also remain on the at least one partial surface 14 and therefore protect the at least one partial surface 14 during the optional formation of the at least one wire bond 26.

In a further method step, the at least one semiconductor component 12 is at least partially surrounded by at least one photoablatable packaging material 28. In this context, at least sacrificial material 16 (and possibly photopatternable material 18) on the at least one partial surface 14 of the at least one semiconductor component 12 is surrounded by packaging material 28. The result is shown in FIG. 1d or 1e.

Photoablatable packaging material 28 can be understood as, e.g., a (plastic-based) material, which is melted and molded around the at least one semiconductor component 12 at a high pressure. In particular, photoablatable packaging material 28 can be a material suitable for molding (molding material). Consequently, the application of packaging material 28 can take place with the aid of a molding method. In this context, in addition to a high pressure, also a high temperature (of up to 250°) can occur, which, besides initial liquefaction of packaging material 28, brings about its subsequent, thermal-initiated curing. Photoablatable packaging material 28 can be, e.g., epoxy resin (possibly including at least one filler). At the high temperatures occurring, a second cure of photopatternable material 18 often takes place, which means that with the exception of using a photoablation process, photopatternable material 18 may only be removed with difficulty.

Figure 1D:
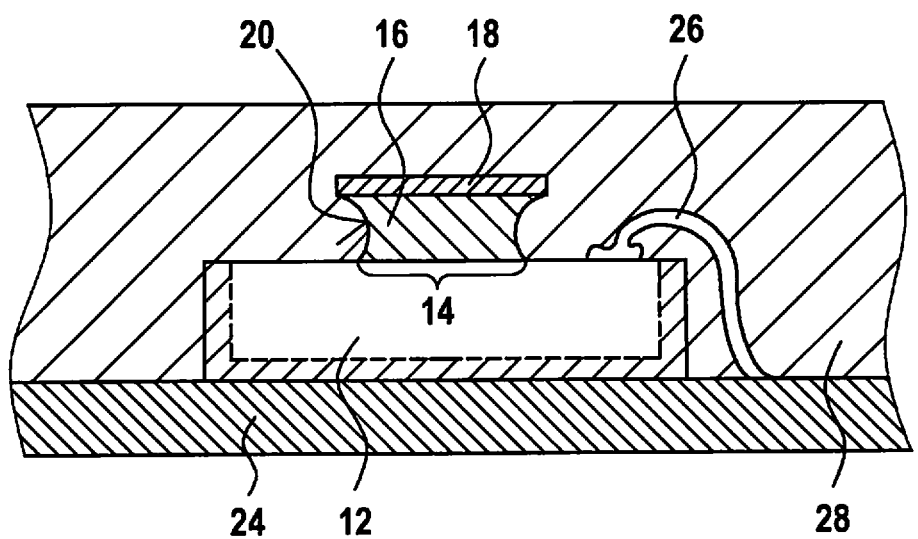
Figure 1E:
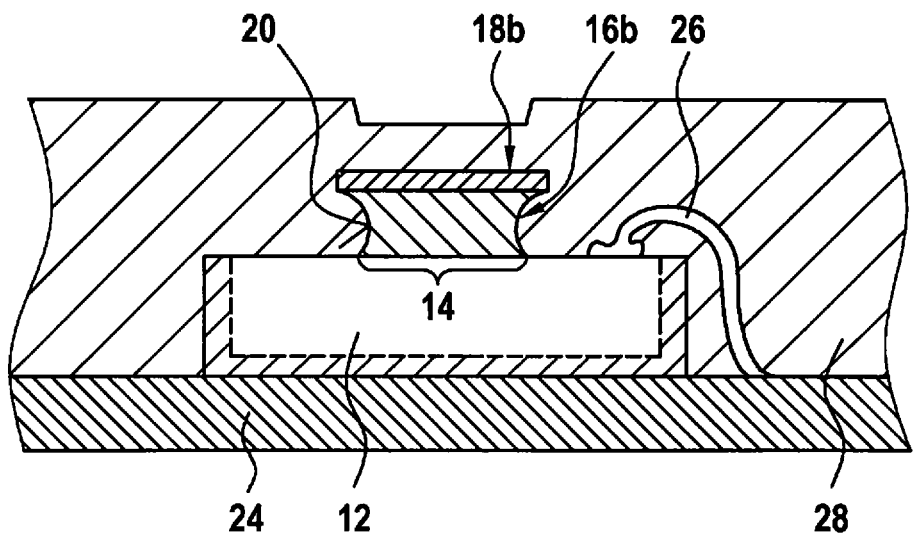

As depicted in FIG. 1d, packaging material 28 can be deposited on circuit board 24 with a (nearly) constant layer thickness, e.g. with a layer thickness of approximately 50 μm. In addition, using a raised part in the mold (implementable as an insert or a stamp) (see FIG. 1e), the layer thickness of the packaging material can be reduced in comparison with other locations, at the at least one location at which it covers residual regions 16b and 18b. (Keeping residual regions 16b and 18b clear during the application of packaging material 28 is, as a rule, not possible due to the tolerances of at least 10 μm or more between a mold and a semiconductor component 12.)

After the at least one semiconductor component 12 is surrounded at least partially by photoablatable packaging material 28, the sacrificial material 16 on the at least one partial surface 14 of the at least one semiconductor component 12 is at least partially exposed. This is accomplished by forming at least one trench 30 through at least the packaging material 28 with the aid of a light beam, at least some regions of packaging material 28 being photoablated. The at least one residual region 18b of photopatternable material 18 can also be removed (at least partially) during the formation of the at least one trench 30 by the light beam. This is advantageous, since, as specified above, photopatternable material 18 can only be removed with difficulty, due to the second cure. However, sacrificial material 16 is preferably not/scarcely attacked during the formation of the at least one trench 30. In particular, to form the at least one trench 30, the same laser can be used, which was also used (previously) to separate semiconductor components 12 and/or is (subsequently) used to inscribe semiconductor components 12/finished semiconductor devices.

With the aid of the light beam, the at least one trench 30 is formed out of packaging material 28 to have, in each instance, at least one first trench wall surface 34, which adjoins an outer boundary surface 32 of packaging material 28, is made of packaging material 28 and has photoablation traces/laser-ablation traces. Such photoablation traces/laser-ablation traces can be, for example, a color change of packaging material 28 (possibly a bleaching of packaging material 28) and/or the bursting-open or chipping-off of glass granules in packaging material 28 directly on the at least one first trench wall surface 34. (The specific outer boundary surface 32 of packaging material 28 is preferably to be understood as a boundary surface of packaging material 28 pointed away from semiconductor component 12.)

Figure 1F:
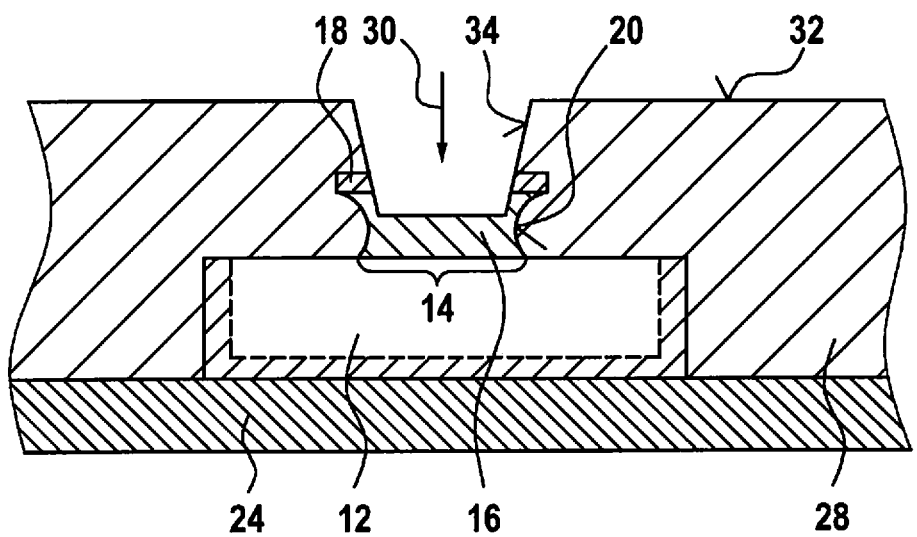

As represented graphically in FIG. 1f, it is not necessary to remove sacrificial material 16 using the light beam. Therefore, a photoablatable/laser-patternable material also does not have to be selected for sacrificial material 16. In addition, it is not necessary to expose sacrificial material 16 completely via the at least one trench 30. Instead, it is sufficient for at least a part of each residual region 16b of sacrificial material 16 to be exposed in such a manner, that future chemical or physical dissolubility of sacrificial material 16 is ensured.

Figure 1G:
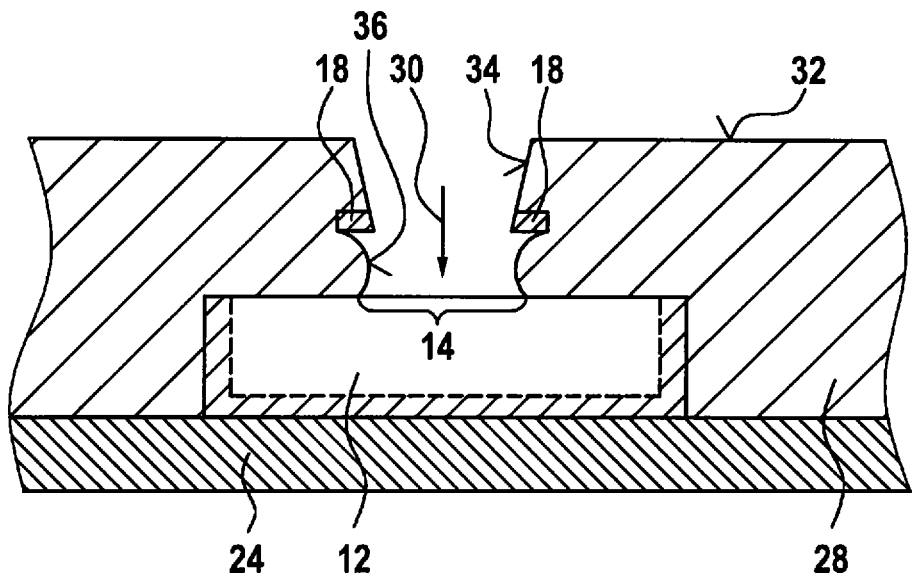

As a further method step, the at least one partial surface 14 of the at least one semiconductor component 12 is at least partially exposed, as represented in FIG. 1g. This is accomplished by at least partially removing previously exposed sacrificial material 16, using a chemical or physical removal method. In so doing, a removal method is implemented, to which packaging material 28 has a higher resistance in comparison with sacrificial material 16. In particular, packaging material 28 can be (nearly) resistant to the chemical or physical removal method.

At least one second trench wall surface 36 of the at least one (extended/deepened) trench 30 is formed by the chemical or physical removal method, the second trench wall surface being closer to associated partial surface 14 in comparison with the at least one first trench wall surface 34 of the same trench 30 (formed by the light ray). The at least one second trench wall surface 36 (formed by the chemical or physical removal method) is made at least partially of the packaging material and is formed with filler removal traces, etching residues and/or molding effects. For example, (with the aid of the chemical or physical removal method,) the at least one second trench wall surface 36 can be formed to have at least one convex area of curvature and/or at least one concave area of curvature (at least partially made up of packaging material 28). (The at least one convex area of curvature can be understood as a bulge "into associated trench 30.") The at least one convex area of curvature (see FIG. 1g) is produced due to the at least one previously concave outer surface 20 of removed sacrificial material 16. Accordingly, at least one concave area of curvature may be produced due to at least one previously convex outer surface of removed sacrificial material 16.

As a rule, the chemical or physical removal method scarcely produces a (significant) change in the at least one first trench wall surface 34 (adjoining outer boundary surface 32). Therefore, (even after the method described here is executed completely,) the at least one trench 30 includes the at least one first trench wall surface 34, which (adjoins outer boundary surface 32,) is made up of packaging material 28 and has photoablation traces/laser-ablation traces, as well as the at least one second trench wall surface 36, which is made at least partially of the packaging material and has filler removal traces, etching residues and/or molding effects.

The at least one trench 30 is free of any metallic coating between the at least one first trench wall surface 34 and the at least one second trench wall surface 36. This is to be understood to mean that all of the inner surfaces of the at least one trench 30 possibly present between the at least one first trench wall surface 34 and the at least one second trench wall surface 36 are not covered by/are free of a metallic coating.

Material residues of the photopatternable material 18 between the at least one first trench wall surface 34 and the at least one second trench wall surface 36 can also remain (after complete execution of the method described here). However, the at least one photopatternable material 18 can also be removed during the chemical or physical removal method (as a function of its ability to be removed during the chemical or physical removal method). In this case, a molding of the material residue of photopatternable layer 18a between the at least one first trench wall surface 34 and the at least one second trench wall surface 36 can be removed.

When executing the method steps described here on the wafer level, the sectioning of semiconductor components 12 is preferably carried out prior to removing sacrificial material 16, since in this case, sacrificial material 16 still provides additional protection to the at least one semiconductor component 12 during the sectioning.

Figure 1H:
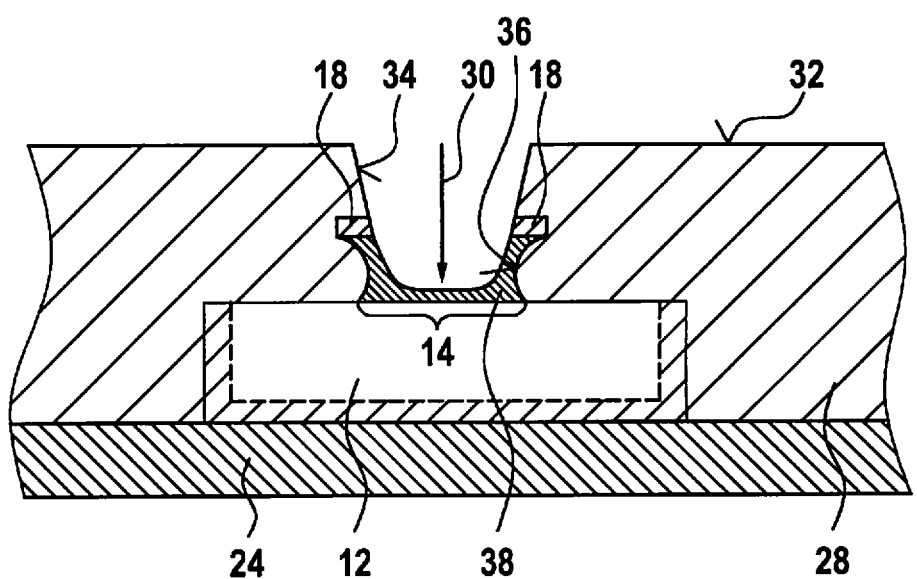

FIG. 1h shows a produced semiconductor device (manufactured by completely executing the method described here), after an optional method step, in which at least one sensitive material 38 for detecting at least one substance is deposited on the at least one exposed partial surface 14.

(Therefore, the at least one semiconductor component 12 packaged with the aid of the method steps described above can advantageously be used as at least one sensor component for detecting the at least one substance.) However, a usefulness of the at least one semiconductor component 12 packaged with the aid of the above-described method steps is not limited to substance detection.

As a further refinement of the method described here, at least two trenches 30 can also be formed per semiconductor component 12. In this case, different sensitive materials can be deposited in the at least two trenches 30 per semiconductor component 12.

For example, a drip method or an ink jet method can be implemented to deposit the at least one sensitive material 38. In all of these methods, the at least one trench 30 can be used as a coating mask. In addition, in all of these methods, a (nearly) homogeneous layer thickness of the at least one sensitive material 38 can optionally be attained (after it dries), or the formation of a (possibly desired) meniscus on the at least one sensitive material 38 can be achieved, by varying the at least one sensitive material 38 and/or a geometry of the at least one trench 30 (e.g., its diameter). The at least one trench 30 can also be filled completely with respective sensitive material 38. In this case, the at least one trench 30 can be filled completely with a solution including a lower concentration of respective sensitive material 38, so that after the solution dries, respective sensitive material 38 also lies on trench wall surfaces 34 and 36.

In addition, the method described above can also be carried out after the at least one sensitive material 38 is deposited on the at least one partial surface 14.

Figure 2A:
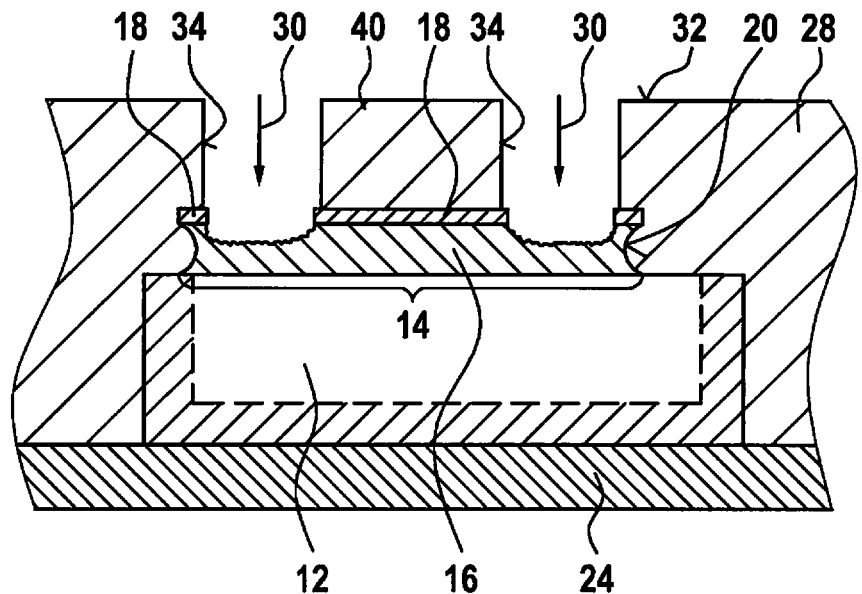
FIGS. 2a-2b are schematic cross sections for explaining a method for packaging at least one semiconductor component, according to a second example embodiment of the present invention.
Figure 2B:
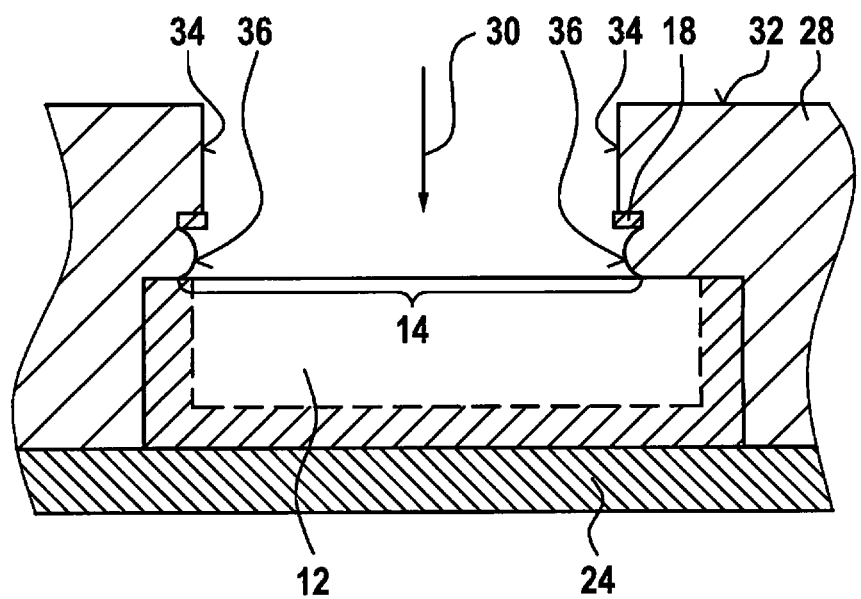

FIGS. 2a and 2b show schematic cross sections for explaining a second example embodiment of the method for packaging at least one semiconductor component.

As is graphically represented in FIG. 2a, in the example embodiment described here, the at least one trench 30 is formed at least through packaging material 28 by the light beam in at least the shape of a (complete) framing of a plug 40. Subsequently, during the at least partial removal of previously exposed sacrificial material 16, plug 40 is also removed by the chemical or physical removal method.

As can be seen with the aid of FIG. 2b, this example embodiment of the method is suited for producing comparatively large openings/cavities (as the at least one trench 30), without a large amount of packaging material 28 additionally having to be removed by the light beam. In addition to the complete framing, further trenches 30, e.g., in the form of a grid or single point openings, can also be formed inside a plug 40 for higher accessibility of sacrificial material 16 during the removal method, and for more effective removal of sacrificial material 16.

Figure 3:
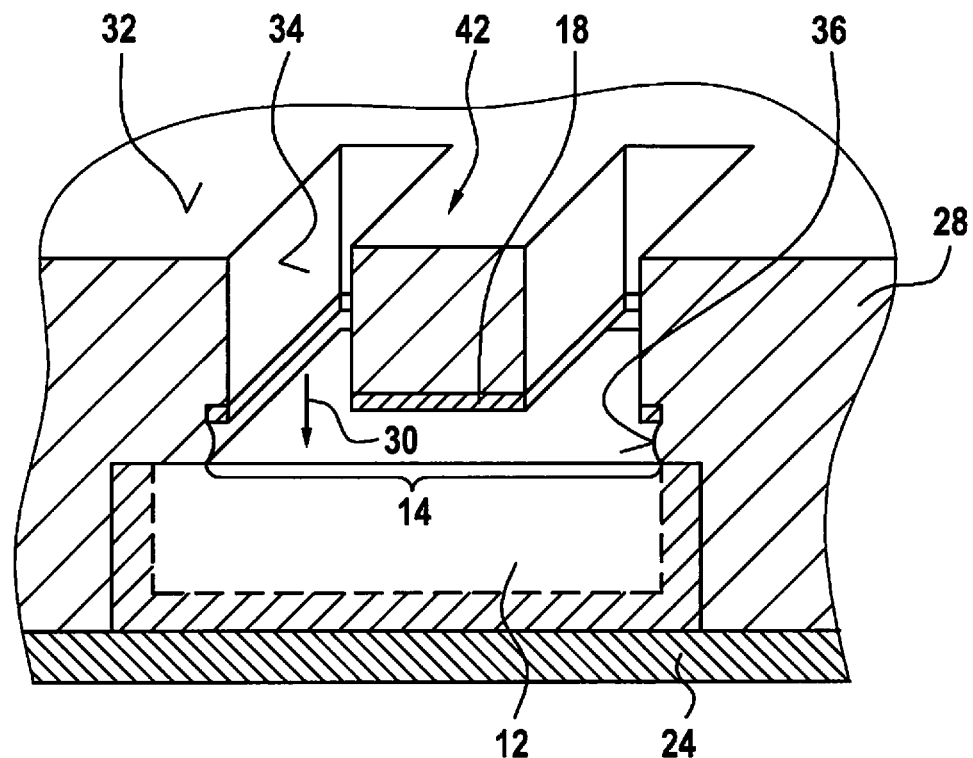
FIG. 3 is a schematic cross section for explaining a method for packaging at least one semiconductor component, according to a third example embodiment of the present invention.

FIG. 3 shows a schematic cross section for explaining a third example embodiment of the method for packaging at least one semiconductor component. In the example embodiment represented in FIG. 3, the at least one trench 30 is formed at least through packaging material 28 by the light beam, in the shape of a partial frame of a future partial shield 42 of the at least one partial surface 14 (made of packaging material 28). Subsequently, sacrificial material 16 situated between partial shield 32 and associated partial surface 14 is at least partially removed with the aid of the chemical or physical removal method. The partial shield remaining after the chemical or physical removal method can provide mechanical protection to the partial surface 14 partially covered by it, from an intrusion of particles or from the action of a force. At the same time, respective partial surface 14 remains connected to an environment of semiconductor component 12 via the trench 30 surrounding its partial shield 42, which means that at least one environmental information item, such as a chemical constituent of the environment, a temperature of the environment, an atmospheric humidity of the environment, and/or a pressure prevailing in the environment is ascertainable with the aid of sensor formed on partial surface 14.

Using any of the methods described above, at least one sensor component in the form of the at least one semiconductor component 12 can be packaged, using packaging material 28; at least one media entrance and/or at least one measuring passage being formed as the at least one trench 30.

Figure 4:
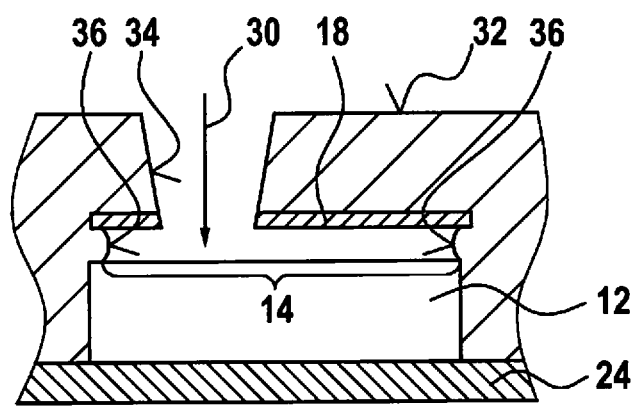
FIG. 4 is a schematic representation of a semiconductor device according to an example embodiment of the present invention.

FIG. 4 shows a schematic representation of an example embodiment of the semiconductor device. The semiconductor device schematically depicted in FIG. 4 includes a semiconductor component 12, which is at least partially surrounded by a photoablatable packaging material 28; at least a partial surface 14 of semiconductor component 12 being exposed with the aid of at least one trench 30 running at least through packaging material 28. The semiconductor device of FIG. 4 is packaged/manufactured, using the above-described method for packaging at least one semiconductor component 12 in packaging material 28. This is, above all, apparent in that the at least one trench 30 is free of any metallic coating between the at least one first trench wall surface 34 and the at least one second trench wall surface 36. (This is to be understood to mean that all of the inner surfaces of the at least one trench 30 possibly present between the at least one first trench wall surface 34 and the at least one second trench wall surface 36 are not covered by/are free of a metallic coating.) In addition, the at least one trench 30 includes, in each instance, at least one first trench wall surface 34, which adjoins an outer boundary surface 32 of packaging material 28, is made of packaging material 28, and has photoablation traces, as well as at least one second trench wall surface 36, which is formed at least partially out of packaging material 28 and has filler removal traces, etching residues, and/or molding effects. In comparison with the at least one first trench wall surface 34 of the same trench 30, the at least one second trench wall surface 36 is situated closer to associated partial surface 14. In particular, the at least one second trench wall surface 36 formed at least partially from the packaging material is formed with at least one convex area of curvature and/or at least one concave area of curvature. Material residues of a previously photopatternable layer 18a can also be present between the at least one first trench wall surface 34 and the at least one second trench wall surface 36. A molding of the material residues of photopatternable layer 18a can be removed between the at least one first trench wall surface 34 and the at least one second trench wall surface 36.

The semiconductor device of FIG. 4 can include a sensor component packaged, using packaging material 28, as semiconductor component 12, and can be formed with at least one media entrance and/or at least one measuring passage in the form of the at least one trench 30. However, the semiconductor device of FIG. 4 can also be used for other purposes.

As is apparent in FIG. 4, (nearly) an entire side of the at least one semiconductor chip 12 can be exposed by the at least one trench 30. On the respective side, semiconductor chip 12 does not have any mechanical contact with packaging material 28. Therefore, the at least one trench 30 can also contribute towards stress decoupling (in particular, for an acceleration sensor). (It is again emphasized that it is not necessary for the semiconductor device to be provided with circuit board 24.)

Figure 5:
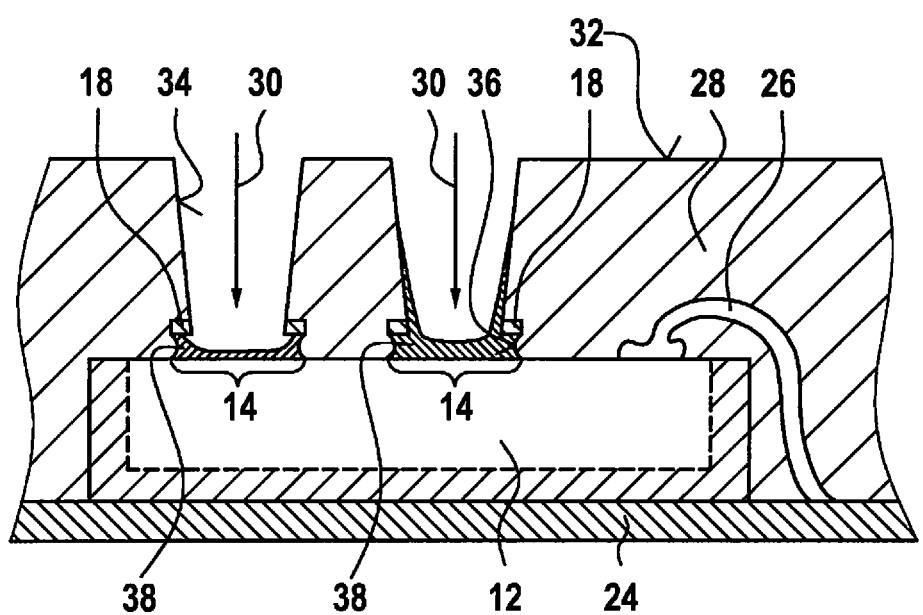
FIG. 5 is a schematic representation of a semiconductor device according to another example embodiment of the present invention.

FIG. 5 shows a schematic representation of a second example embodiment of the semiconductor device. The semiconductor device of FIG. 5 configured as a chemical detection sensor includes at least one sensitive material 38 for detecting at least one substance, the sensitive material being deposited on the at least one exposed partial surface 14. In particular, the semiconductor device includes at least two trenches 30 having different sensitive materials 38.

What is claimed is:

1. A method for packaging at least one semiconductor component, the method comprising:

covering at least one partial surface of the at least one semiconductor component with at least one chemically or physically dissoluble sacrificial material;

depositing a photopatternable material on the sacrificial material;

surrounding the at least one semiconductor component at least partially with a photoablatable packaging material, wherein at least a part of the sacrificial material on the at least one partial surface and at least a part of the photopatternable material are also surrounded by the photoablatable packaging material;

exposing the sacrificial material on the at least one partial surface of the at least one semiconductor component at least partially by forming at least one trench that extends through the photoablatable packaging material and through at least part of the photopatternable material deposited on the sacrificial material using a light beam; and using a chemical or physical removal method to which the photoablatable packaging material has a higher resistance than does the sacrificial material, exposing the at least one partial surface at least partially by at least partially removing the previously exposed sacrificial material;

wherein:
(I) (a) the covering the at least one partial surface with the sacrificial material and the depositing of the photopatternable material on the sacrificial material, which are both performed prior to the surrounding step and the exposing steps, include depositing a layer of the sacrificial material on the at least one semiconductor component, depositing a layer of the photopatternable material on the layer of the sacrificial material, and patterning the layers of the photopatternable material and sacrificial material, so that portions of the layers of the photopatternable material and sacrificial material are removed, leaving on the at least one partial surface a remaining region of the sacrificial layer with a remaining region of the photopatternable material on the remaining region of the sacrificial layer; and (b) the surrounding includes surrounding at least a part of the remaining region of the photopatternable material and at least part of the remaining region of the sacrificial layer; and/or
(II) the method further comprises depositing a sensitive material for detecting at least one substance in the at least one trench so that the sensitive material fills a bottom of a center open area of the at least one trench and fills at least one peripheral open area of the at least one trench so that part of the sensitive material is bounded on top of the part of the sensitive material by at least a part of the photopatternable material, with a portion of the photoablatable packaging material being arranged on top of the at least the part of the photopatternable material.

2. The method of claim 1, wherein, with respect to each respective one of the at least one trench:
(I) the forming of the respective trench exposes the sacrificial material on a respective corresponding one of the at least one partial surface; and
(II) the respective trench:
(a) using the light beam, is formed to have at least one first trench wall surface that:
(1) adjoins an outer boundary surface of the photoablatable packaging material;
(2) is made of the photoablatable packaging material; and
(3) has photoablation traces;
(b) using the chemical or physical removal method, is formed to have at least one second trench wall surface that:
(1) compared to the at least one first trench wall surface of the respective trench, is closer to the associated respective corresponding one of the at least one partial surface;
(2) is made at least partially of the photoablatable packaging material; and
(3) is formed with at least one of filler removal traces, etching residues, and molding effects; and
(c) between the at least one first trench wall surface of the respective trench and the at least one second trench wall surface of the respective trench, is formed free of a metallic coating.

3. The method of claim 2, wherein:
to cover the at least one partial surface, the sacrificial material layer of the sacrificial material is deposited on the at least one semiconductor component and patterned such that the at least one partial surface remains covered by the sacrificial material; and
at least one outer surface of the sacrificial material, that is concave or convex and that covers the at least one partial surface, is formed, so that the at least one second trench wall surface made at least partially of the photoablatable packaging material is formed with a concave or convex area of curvature.

4. The method of claim 3, wherein:
in order to pattern the sacrificial material layer, the photopatternable layer, which is on the sacrificial material layer, is patterned; and
at least one residual region of the photopatternable layer is removed partially by the light beam during the formation of the at least one trench, so that material residues of the photopatternable layer remain between the at least one first trench wall surface and the at least one second trench wall surface.

5. The method of claim 3, wherein:
in order to pattern the sacrificial material layer, a photopatternable layer on the sacrificial material layer is patterned; and
at least one residual region of the photopatternable layer is removed partially by the light beam during the formation of the at least one trench.

6. The method of claim 1, wherein the at least one semiconductor component is at least one sensor component, and the at least one trench is at least one media entrance or measuring passage of the at least one sensor component.

7. The method of claim 6, wherein at least one sensitive material for detecting at least one substance is deposited on the at least one exposed partial surface.

8. The method of claim 1, wherein:
the at least one trench formed through the photoablatable packaging material includes a shape of a framing of a plug; and
during removal of the previously exposed sacrificial material, the plug is also removed at least partially by the chemical or physical removal method.

9. The method of claim 1, wherein:
the at least one trench formed through at least the photoablatable packaging material includes a form of a partial framing of a partial shield of the at least one partial surface; and
the sacrificial material situated between the partial shield and the respective partial surface is at least partially removed using the chemical or physical removal method.

10. The method of claim 1, wherein:
the covering the at least one partial surface with the sacrificial material and the depositing of the photopatternable material on the sacrificial material, which are both performed prior to the surrounding step and the exposing steps, include the depositing of the layer of the sacrificial material on the at least one semiconductor component, depositing the layer of the photopatternable material on the layer of the sacrificial material, and the patterning of the layers of the photopatternable material and sacrificial material, so that the portions of the layers of the photopatternable material and sacrificial material are removed, leaving on the at least one partial surface the remaining region of the sacrificial layer with the remaining region of the photopatternable material on the remaining region of the sacrificial layer; and the surrounding includes surrounding the at least the part of the remaining region of the photopatternable material and the at least part of the remaining region of the sacrificial layer.

11. The method of claim 10, wherein the removal method results in:

the center open area, the center open area extending upward from the at least one partial surface through the remaining region of the photopatternable material and through the photoablatable packaging material above the remaining region of the photopatternable material; and the at least one peripheral open area, the at least one peripheral open area being over the at least one partial surface that is bounded on top of the at least one peripheral open area by at least a part of the remaining region of the photopatternable material, with the portion of the photoablatable packaging material being arranged on top of the at least the part of the remaining region of the photopatternable material.

12. The method of claim 11, wherein the method comprises the depositing of the sensitive material in the at least one trench, and wherein the depositing results in the sensitive material filling the bottom of the center open area and filling the at least one peripheral open area so that part of the sensitive material is bounded on top of the part of the sensitive material by the at least the part of the remaining region of the photopatternable material, with the portion of the photoablatable packaging material being arranged on top of the at least the part of the remaining region of the photopatternable material.

13. The method of claim 1, wherein the method comprises the depositing of the sensitive material.

14. The method of claim 13, wherein the at least one substance includes a plurality of different substances, and the sensitive material differs between different ones of the at least trench so that the semiconductor component is thereby configured to detect respective ones of the plurality of different substances by corresponding respective ones of the at least one trench.

15. The method of claim 13, wherein the depositing of the sensitive material is performed after the at least partial removal of the previously exposed sacrificial material and at least a portion of the deposited sensitive material occupies a space that had previously been occupied by at least a portion of the sacrificial material.

16. A method for packaging at least one semiconductor sensor component, the method comprising:

covering at least one partial surface of the at least one semiconductor sensor component with at least one chemically or physically dissoluble sacrificial material;

surrounding the at least one semiconductor sensor component at least partially with a photoablatable packaging material, wherein at least a part of the sacrificial material on the at least one partial surface is also surrounded by the photoablatable packaging material;

exposing the sacrificial material on the at least one partial surface of the at least one semiconductor sensor component at least partially by forming at least one trench through the photoablatable packaging material using a light beam;

using a chemical or physical removal method to which the photoablatable packaging material has a higher resistance than does the sacrificial material, exposing the at least one partial surface at least partially by at least partially removing the previously exposed sacrificial material; and depositing at least one sensitive material for detecting at least one substance on the at least one exposed partial surface;

wherein the at least one trench includes at least two trenches per semiconductor sensor component that each is a respective media entrance or measuring passage, and the at least one sensitive material includes different sensitive materials deposited in the at least two trenches per semiconductor sensor component.

17. A semiconductor device comprising:

a semiconductor component at least partially surrounded by a photoablatable packaging material;

wherein:

on at least a partial surface of the semiconductor component there is a trench that runs at least through the photoablatable packaging material and that:

(I) includes:

(1) at least one first trench wall surface that adjoins an outer boundary surface of the photoablatable packaging material, is made of the photoablatable packaging material, and has photoablation traces;

(2) at least one second trench wall surface that, compared to the at least one first trench wall surface of the trench, is closer to the partial surface and further from a center of the trench, is made at least partially of the photoablatable packaging material, and is formed with at least one of filler removal traces, etching residues, and molding effects;

(3) a photopatternable material between the at least one first trench wall surface and the at least one second trench wall surface; and (4) a sensitive material for detecting at least one substance filling a bottom of a center region of the trench and filling at least one peripheral region of the trench, with the sensitive material in the at least one peripheral region being bounded on top of the sensitive material by the photopatternable material; and (II) is free of a metallic coating between the at least one first trench wall surface and the at least one second trench wall surface.

18. The semiconductor device of claim 17, wherein the at least one second trench wall surface is formed with a convex or concave area of curvature.

19. The semiconductor device of claim 17, wherein the semiconductor component is a sensor component, and the trench forms at least one of at least one media entrance and at least one measuring passage of the sensor.

20. A semiconductor device comprising:

a semiconductor sensor component at least partially surrounded by a photoablatable packaging material;

wherein:

at least a partial surface of the semiconductor sensor component is exposed by at least two trenches running at least through the photoablatable packaging material and having therein different sensitive materials for detecting at least one substance deposited on the exposed partial surfaces; and each respective one of the at least two trenches:

forms a media entrance and/or a measuring passage of the sensor component;

includes:
- at least one first trench wall surface that adjoins an outer boundary surface of the photoablatable packaging material, is made of the photoablatable packaging material, and has photoablation traces; and
- at least one second trench wall surface that, compared to the at least one first trench wall surface of the respective trench, is closer to the corresponding partial surface, is made at least partially of the photoablatable packaging material, and is formed with at least one of filler removal traces, etching residues, and molding effects; and is free of a metallic coating between the at least one first trench wall surface and the at least one second trench wall surface.

\* \* \* \* \*